(12) United States Patent
McSherry et al.

(10) Patent No.: US 8,694,950 B2
(45) Date of Patent: Apr. 8, 2014

(54) METHODS, SYSTEMS, AND ARTICLES OF MANUFACTURE FOR IMPLEMENTING ELECTRONIC CIRCUIT DESIGNS WITH ELECTRICAL AWARENESS

(75) Inventors: Michael McSherry, Portland, OR (US); David White, San Jose, CA (US); Ed Fischer, Salem, OR (US); Bruce Yanagida, Snohomish, WA (US); Prakash Gopalakrishnan, Wayne, NJ (US); Keith Dennison, Edinburgh (GB); Akshat Shah, Pittsburgh, PA (US)

(73) Assignee: Cadence Design Systems, Inc., San Jose, CA (US)

( * ) Notice: Subject to any disclaimer, the term of this patent is extended or adjusted under 35 U.S.C. 154(b) by 122 days.

(21) Appl. No.: 12/982,721

(22) Filed: Dec. 30, 2010

(65) Prior Publication Data

US 2012/0023467 A1    Jan. 26, 2012

Related U.S. Application Data

(60) Provisional application No. 61/367,398, filed on Jul. 24, 2010, provisional application No. 61/367,412, filed on Jul. 24, 2010, provisional application No. 61/367,404, filed on Jul. 24, 2010, provisional application No. 61/367,406, filed on Jul. 24, 2010, provisional application No. 61/367,407, filed on Jul. 24, 2010, provisional application No. 61/367,410, filed on Jul. 24, 2010.

(51) Int. Cl.
*G06F 17/50* (2006.01)

(52) U.S. Cl.
USPC .............................. 716/136; 716/111; 703/14

(58) Field of Classification Search
USPC .................................................. 716/111, 136
See application file for complete search history.

(56) References Cited

U.S. PATENT DOCUMENTS

| 4,817,012 A | 3/1989 | Cali' |
| 5,469,366 A | 11/1995 | Yang et al. |

(Continued)

OTHER PUBLICATIONS

International Search Report and Written Opinion dated Sep. 16, 2011 for PCT App. No. PCT/US11/45119.

(Continued)

*Primary Examiner* — Thuan Do
(74) *Attorney, Agent, or Firm* — Vista IP Law Group, LLPX

(57) ABSTRACT

Disclosed are a method, system, and computer program product for implementing electronic circuit designs with electrical awareness. The method or the system updates the schematic level tool(s) and physical design tool(s) with electrical parasitic data or electrical characteristic data associated with electrical parasitics so both schematic and physical design tools are aware of the electrical parasitic or characteristic data in performing their functions such as extraction based simulations. The methods or systems are also aware of EM or IR-drop constraint(s) while implementing or creating a partial layout less than a complete layout. The method or the system also provides a user interface for a design tool to provide in situ, customizable, real-time information for implementing electronic circuit designs with electrical awareness. The methods or systems also support constraint verification for electronic circuit design implementation with electrical awareness.

35 Claims, 11 Drawing Sheets

(56) References Cited

U.S. PATENT DOCUMENTS

| | | |
|---|---|---|
| 5,553,002 A | 9/1996 | Dangelo et al. |
| 5,629,857 A | 5/1997 | Brennan |
| 5,801,958 A * | 9/1998 | Dangelo et al. ............... 716/102 |
| 5,872,952 A | 2/1999 | Tuan et al. |
| 5,999,726 A | 12/1999 | Ho |
| 6,072,945 A | 6/2000 | Aji et al. |
| 6,131,182 A | 10/2000 | Beakes et al. |
| 6,378,110 B1 | 4/2002 | Ho |
| 6,438,729 B1 | 8/2002 | Ho |
| 6,449,578 B1 | 9/2002 | McBride |
| 6,470,482 B1 | 10/2002 | Rostoker et al. |
| 6,507,932 B1 | 1/2003 | Landry et al. |
| 6,523,150 B1 | 2/2003 | Buffet et al. |
| 6,539,533 B1 | 3/2003 | Brown et al. |
| 6,553,554 B1 | 4/2003 | Dahl et al. |
| 6,584,606 B1 | 6/2003 | Chiu et al. |
| 6,643,836 B2 | 11/2003 | Wheeler et al. |
| 6,665,845 B1 | 12/2003 | Aingaran et al. |
| 6,701,508 B1 | 3/2004 | Bartz et al. |
| 6,842,714 B1 | 1/2005 | Acar et al. |
| 6,877,148 B1 | 4/2005 | Hassibi et al. |
| 6,910,200 B1 | 6/2005 | Aubel et al. |
| 6,954,915 B2 | 10/2005 | Batchelor |
| 6,971,074 B2 | 11/2005 | Hasegawa et al. |
| 6,981,238 B1 | 12/2005 | Churchill |
| 7,016,794 B2 | 3/2006 | Schultz |
| 7,020,853 B2 | 3/2006 | Skoll et al. |
| 7,069,526 B2 | 6/2006 | Schubert et al. |
| 7,076,410 B1 | 7/2006 | Kerzman et al. |
| 7,089,129 B2 | 8/2006 | Habitz |
| 7,152,215 B2 | 12/2006 | Smith et al. |
| 7,159,202 B2 | 1/2007 | Lee et al. |
| 7,178,118 B2 | 2/2007 | Ramachandran et al. |
| 7,181,383 B1 | 2/2007 | McGaughy et al. |
| 7,206,731 B2 * | 4/2007 | Sercu et al. ..................... 703/14 |
| 7,228,514 B2 | 6/2007 | Chan et al. |
| 7,243,317 B2 | 7/2007 | Wang et al. |
| 7,251,800 B2 | 7/2007 | McElvain et al. |
| 7,278,120 B2 | 10/2007 | Rahmat et al. |
| 7,331,029 B2 | 2/2008 | Amit et al. |
| 7,347,621 B2 | 3/2008 | Sri-Jayantha et al. |
| 7,356,784 B1 | 4/2008 | Dengi et al. |
| 7,383,521 B2 | 6/2008 | Smith et al. |
| 7,395,519 B2 | 7/2008 | Kawata |
| 7,559,045 B2 | 7/2009 | Chen et al. |
| 7,567,894 B2 | 7/2009 | Durand et al. |
| 7,574,682 B2 | 8/2009 | Riviere-Cazaux |
| 7,596,771 B2 | 9/2009 | Cohen et al. |
| 7,640,527 B1 | 12/2009 | Doraira et al. |
| 7,797,646 B2 | 9/2010 | Chung et al. |
| 7,802,222 B2 | 9/2010 | Arsintescu |
| 7,805,698 B1 | 9/2010 | Ferguson et al. |
| 7,810,063 B1 | 10/2010 | Sharma et al. |
| 7,818,697 B2 | 10/2010 | Cho |
| 7,904,852 B1 | 3/2011 | Cadouri et al. |
| 7,941,768 B1 | 5/2011 | Wei |
| 7,966,588 B1 | 6/2011 | Perry et al. |
| 8,141,013 B2 | 3/2012 | Woods et al. |
| 8,150,638 B1 | 4/2012 | Wu et al. |
| 8,185,856 B2 | 5/2012 | Izuha |
| 8,224,636 B2 | 7/2012 | Kundert |
| 8,261,228 B1 | 9/2012 | Gopalakrishnan et al. |
| 2002/0166102 A1 | 11/2002 | Du et al. |
| 2003/0131323 A1 | 7/2003 | McConaghy |
| 2004/0049747 A1 | 3/2004 | Yamasaki et al. |
| 2004/0078767 A1 | 4/2004 | Burks et al. |
| 2004/0117748 A1 | 6/2004 | Tester |
| 2004/0117750 A1 | 6/2004 | Skoll et al. |
| 2004/0128368 A1 | 7/2004 | Sakai |
| 2004/0128638 A1 | 7/2004 | Kerzman et al. |
| 2004/0143809 A1 | 7/2004 | Cowan et al. |
| 2004/0243949 A1 | 12/2004 | Wang et al. |
| 2005/0010922 A1 | 1/2005 | Czajkowski et al. |
| 2005/0114818 A1 | 5/2005 | Khakzadi et al. |
| 2005/0216873 A1 | 9/2005 | Singh et al. |
| 2005/0268258 A1 | 12/2005 | Decker |
| 2005/0268269 A1 | 12/2005 | Coiley |
| 2005/0273732 A1 | 12/2005 | Xu et al. |
| 2005/0278665 A1 | 12/2005 | Gentry et al. |
| 2006/0095884 A1 | 5/2006 | Skoll et al. |
| 2006/0095889 A1 | 5/2006 | Cote et al. |
| 2006/0101368 A1 | 5/2006 | Kesarwani et al. |
| 2006/0123364 A1 | 6/2006 | Cook et al. |
| 2007/0094622 A1 | 4/2007 | Lee et al. |
| 2007/0106969 A1 | 5/2007 | Birch et al. |
| 2007/0118827 A1 | 5/2007 | Rahman |
| 2007/0234266 A1 | 10/2007 | Chen et al. |
| 2007/0245274 A1 | 10/2007 | Kimura |
| 2007/0299647 A1 | 12/2007 | Bolcato et al. |
| 2008/0022251 A1 | 1/2008 | McConaghy et al. |
| 2008/0133201 A1 | 6/2008 | Guedon |
| 2008/0148195 A1 | 6/2008 | Chan et al. |
| 2008/0209365 A1 | 8/2008 | Riviere-Cazaux |
| 2008/0244497 A1 | 10/2008 | Zhao et al. |
| 2008/0244498 A1 | 10/2008 | Gupta et al. |
| 2009/0019411 A1 | 1/2009 | Chandra et al. |
| 2009/0031261 A1 | 1/2009 | Smith et al. |
| 2009/0089733 A1 | 4/2009 | Chang et al. |
| 2009/0144042 A1 | 6/2009 | Lorenz et al. |
| 2009/0150842 A1 | 6/2009 | Kemerer et al. |
| 2009/0254874 A1 | 10/2009 | Bose |
| 2009/0265672 A1 | 10/2009 | St. John et al. |
| 2010/0083200 A1 | 4/2010 | Song et al. |
| 2010/0217577 A1 | 8/2010 | Korobkov et al. |
| 2011/0107293 A1 | 5/2011 | Ganzhorn et al. |
| 2011/0197170 A1 | 8/2011 | Chandramohan et al. |
| 2011/0314437 A1 | 12/2011 | Mcilrath |
| 2012/0022846 A1 | 1/2012 | White et al. |
| 2012/0023465 A1 | 1/2012 | Gopalakrishnan et al. |
| 2012/0023467 A1 | 1/2012 | McSherry et al. |
| 2012/0117530 A1 | 5/2012 | Green |

OTHER PUBLICATIONS

International Search Report and Written Opinion dated Sep. 16, 2011 for PCT App. No. PCT/US11/45110.

International Search Report and Written Opinion dated Sep. 22, 2011 for PCT App. No. PCT/US11/45126.

International Search Report and Written Opinion dated Sep. 22, 2011 for PCT App. No. PCT/US11/45123.

International Search Report and Written Opinion dated Dec. 9, 2011 for PCT App. No. PCT/US11/45104.

International Search Report and Written Opinion dated Dec. 7, 2011 for PCT App. No. PCT/US11/45091.

Non-Final Office Action dated Jun. 24, 2013 for U.S. Appl. No. 12/982,762.

Non-Final Office Action dated Aug. 6, 2013 for U.S. Appl. No. 12/982,732.

Non-Final Office Action dated Aug. 20, 2013 for U.S. Appl. No. 13/189,274.

Non-Final Office Action dated Jun. 15, 2012 for U.S. Appl. No. 12/982,822.

Non-Final Office Action dated Jun. 12, 2012 for U.S. Appl. No. 12/982,628.

Non-Final Office Action dated Sep. 14, 2012 for U.S. Appl. No. 13/189,274.

Notice of Allowance dated Nov. 14, 2012 for U.S. Appl. No. 12/982,628.

Final Office Action dated Nov. 13, 2012 for U.S. Appl. No. 12/982,822.

Non-Final Office Action dated Oct. 3, 2012 for U.S. Appl. No. 12/982,732.

T. Quarles, "SPICE3 Version 3f3 User's Manual", May 1993.

Non-Final Office Action dated Jan. 18, 2013 for U.S. Appl. No. 12/982,790.

Noitce of Allowance dated Jan. 7, 2013 for U.S. Appl. No. 13/189/274.

(56) References Cited

OTHER PUBLICATIONS

Final Office Action dated Feb. 19, 2013 for U.S. Appl. No. 12/982,732.
Final Office Action dated May 2, 2013 for U.S. Appl. No. 12/982,790.
Final Office Action dated Dec. 17, 2013 for U.S. Appl. No. 12/982,762.
Notice of Allowance dated Dec. 4, 2013 for U.S. Appl. No. 13/189,274.
Notice of Allowance dated Nov. 12, 2013 for U.S. Appl. No. 12/982,790.
Notice of Allowance dated Dec. 9, 2013 for U.S. Appl. No. 12/982,732.

* cited by examiner

METHODS, SYSTEMS, AND ARTICLES OF MANUFACTURE FOR IMPLEMENTING ELECTRONIC CIRCUIT DESIGNS WITH ELECTRICAL AWARENESS

CROSS-REFERENCE TO RELATED APPLICATION(S)

This application claims the benefit of U.S. Provisional App. Ser. No. 61/367,398, filed on Jul. 24, 2010 and entitled "METHODS, SYSTEMS, AND ARTICLES OF MANUFACTURE FOR CONSTRAINT VERIFICATION FOR IMPLEMENTING ELECTRONIC CIRCUIT DESIGNS WITH ELECTRICAL AWARENESS", U.S. Provisional App. Ser. No. 61/367,412, filed on Jul. 24, 2010 and entitled "METHODS, SYSTEMS, AND ARTICLES OF MANUFACTURE FOR IMPLEMENTING ELECTRONIC CIRCUIT DESIGNS WITH ELECTRICAL AWARENESS", U.S. Provisional App. Ser. No. 61/367,404, filed on Jul. 24, 2010 and entitled "METHODS, SYSTEMS, AND ARTICLES OF MANUFACTURES FOR IMPLEMENTING ELECTRONIC CIRCUIT DESIGNS WITH ELECTRO-MIGRATION AWARENESS", U.S. Provisional App. Ser. No. 61/367,406, filed on Jul. 24, 2010 and entitled "METHODS, SYSTEMS, AND ARTICLES OF MANUFACTURES FOR IMPLEMENTING ELECTRONIC CIRCUIT DESIGNS WITH IR-DROP AWARENESS", U.S. Provisional App. Ser. No. 61/367,412, filed on Jul. 24, 2010 and entitled "METHODS, SYSTEMS, AND ARTICLES OF MANUFACTURES FOR IMPLEMENTING ELECTRONIC CIRCUIT DESIGNS WITH SIMULATION AWARENESS", U.S. Provisional App. Ser. No. 61/367,410, filed on Jul. 24, 2010 and entitled "METHOD, APPARATUS, AND ARTICLE OF MANUFACTURE FOR PROVIDING IN SITU, CUSTOMIZABLE INFORMATION IN DESIGNING ELECTRONIC CIRCUITS WITH ELECTRICAL AWARENESS". The entire contents of the aforementioned applications are hereby expressly incorporated by reference in their entirety.

This application is related to U.S. patent application Ser. No. 12/982,762, entitled "METHODS, SYSTEMS, AND ARTICLES OF MANUFACTURE FOR IMPLEMENTING ELECTRONIC CIRCUIT DESIGNS WITH ELECTRO-MIGRATION AWARENESS", U.S. patent application Ser. No. 12/982,790, entitled "METHODS, SYSTEMS, AND ARTICLES OF MANUFACTURE FOR IMPLEMENTING ELECTRONIC CIRCUIT DESIGNS WITH SIMULATION AWARENESS", U.S. patent application Ser. No. 12/982,628, entitled "METHOD, APPARATUS, AND ARTICLE OF MANUFACTURE FOR PROVIDING IN SITU, CUSTOMIZABLE INFORMATION IN DESIGNING ELECTRONIC CIRCUITS WITH ELECTRICAL AWARENESS", and U.S. patent application Ser. No. 12/982,732, entitled "METHODS, SYSTEMS, AND ARTICLES OF MANUFACTURE FOR CONSTRAINT VERIFICATION FOR IMPLEMENTING ELECTRONIC CIRCUIT DESIGNS WITH ELECTRICAL AWARENESS". The entire disclosures of the above applications are hereby expressly incorporated by reference in their entireties in the instant Application.

BACKGROUND

The recent advances in very deep sub-micron (VDSM) integrated circuits (ICs) have brought new challenges in the physical design methodology process of integrated systems. For example, most conventional electronic circuit design tools focus on post-layout verification of the power grid or interconnects when the entire chip design is complete and detailed information about the parasitics of the physical designs and the currents drawn by the transistors are known. In these conventional approaches, the conventional circuit synthesis step is followed by layout synthesis and each step is carried out independent of the other. This is again followed by a physical or formal verification step upon the completion of the entire physical layout to check whether the desired performance goals have been achieved after layout generation and extraction. These steps are carried out iteratively in the conventional approaches till the desired performance goals are met.

Nonetheless, such an iterative approach wastes significant amount of resources because various physical design tools, such as the placement tool, the router, etc., and various schematic design tools, such as the schematic editor, the schematic level simulator(s), etc., are unaware of the electrical parasitics associated with the physical data of the design and the electrical characteristics associated with the electrical parasitics.

Thus, there exists a need for implementing electronic circuit designs with electrical awareness early in the design stage.

SUMMARY

What is needed is a method, a system, and a computer program product for implementing electronic circuit designs with electrical awareness. In various embodiments directed to a hardware system implementing the electronic circuit designs with electrical awareness, the system may comprise a module for implementing electronic circuit designs with simulation awareness. The system may further comprise a module for parasitic constraint verification for implementing electronic circuit designs with electrical awareness in some embodiments. Furthermore, the system may also comprise a module for implementing electronic circuit designs with electro-migration (EM) and/or IR-drop awareness in some embodiments. In addition or in the alternative, the system may comprise a user interface providing in situ, real-time, customizable information for implementing electronic circuit designs with electrical awareness in some embodiments.

Some embodiments are directed at methods for implementing electronic circuit designs with electrical awareness. More details about various processes or modules will be further described in the following paragraphs with reference to the corresponding figures.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAIL DESCRIPTION

Various embodiments of the invention are directed to a methods, systems, and articles of manufacture for implementing electronic circuit designs with electrical awareness in a single embodiment or in some embodiments. Other objects, features, and advantages of the invention are described in the detailed description, figures, and claims.

Various embodiments will now be described in detail with reference to the drawings, which are provided as illustrative examples of the invention so as to enable those skilled in the art to practice the invention. Notably, the figures and the examples below are not meant to limit the scope of the invention. Where certain elements of the present invention can be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments of the present invention encompasses present and future known equivalents to the components referred to herein by way of illustration.

Figure 1:
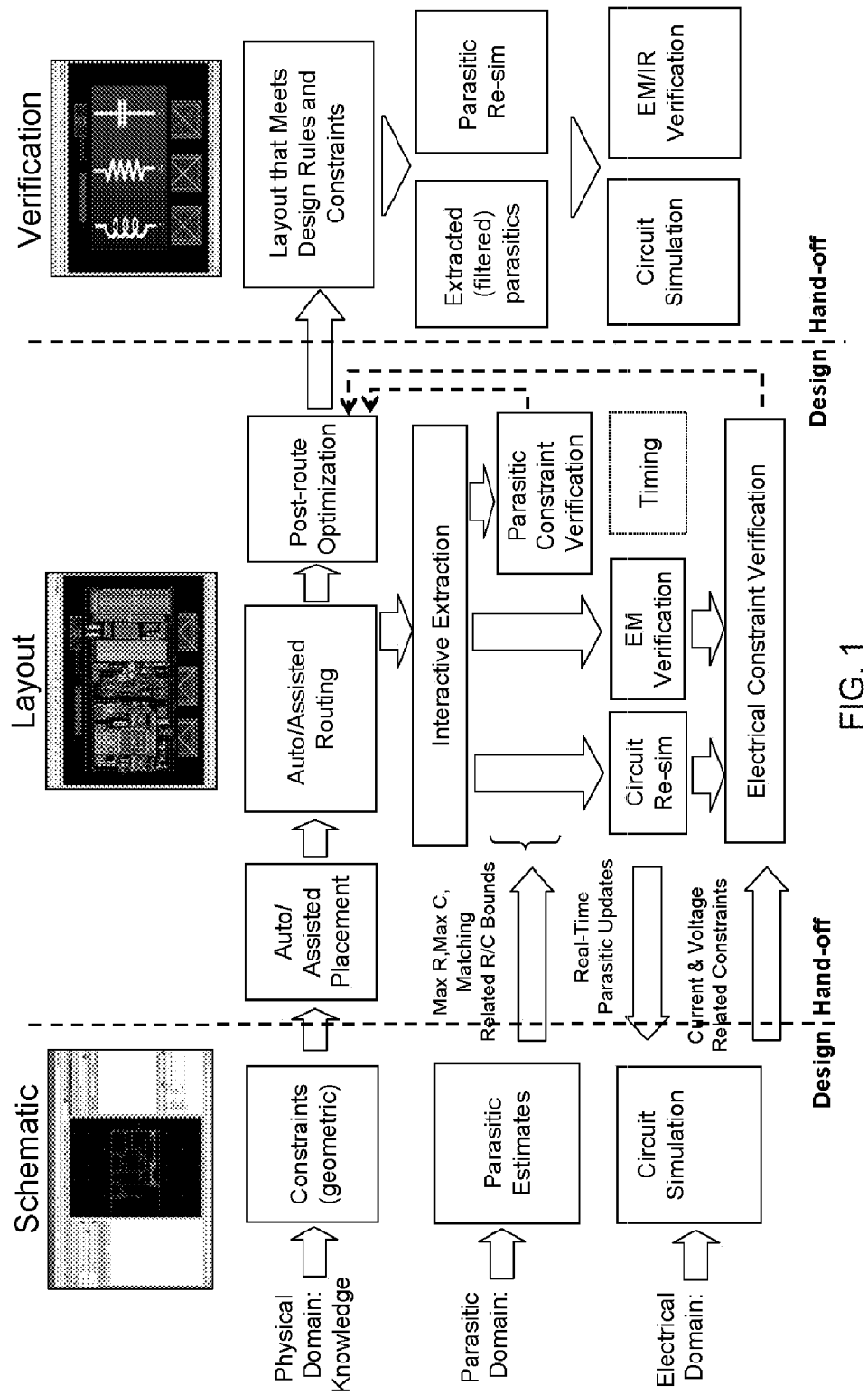
FIG. 1 illustrates a top level block diagram for a method or system for implementing electronic circuit design with electrical awareness in some embodiments.

FIG. 1 illustrates a top level diagram for a method or system for implementing electronic circuit design with electro-migration awareness in some embodiments. FIG. 1 illustrates that the system may comprise one or more modules. For example, the system may comprise the constraints module, the parasitic estimate module, or the circuit simulation module, etc. in the schematic level in some embodiments.

The system may also comprise the automatic/assisted placement tool, the automatic/assisted global/detailed routing tool(s), the post-route optimization tool(s), the extractor, the module for implementing electronic circuit designs with simulation awareness, the module for implementing electronic circuit designs with electro-migration/IR-drop awareness, the module for constraint verification for implementing electronic circuit designs with electrical awareness, timing analysis tool(s), etc. in the physical domain in some embodiments. In some embodiments, the system comprises one or more schematic level tools and one or more physical level tools but does not comprise any post-layout tools that require a complete layout to operate and may comprise, for example but not limited to, the post-layout physical, formal, or other verification tool(s), the layout-versus-schematic (LVS) tool(s), etc. because various modules described herein already perform the functions and thus displace the need for such post-layout tools.

The system may also comprise some post-layout verification tools that require a complete layout of an electronic circuit design in some embodiments. The verification tools may comprise, for example, some DRC (design rule checking) tools, some post-layout parasitic re-simulation tools, design tools for extracting or filtering parasitics, design tools for circuit simulations, design tools for electro-migration/IR-drop analyses or verification, physical verification tools, etc. Some embodiments are directed at various processes performed by some of the aforementioned sub-systems for implementing electronic circuit designs with electrical awareness. Various modules of the system or various processes of the method will be described in greater details in the following paragraphs with reference to various figures.

Figure 2A:
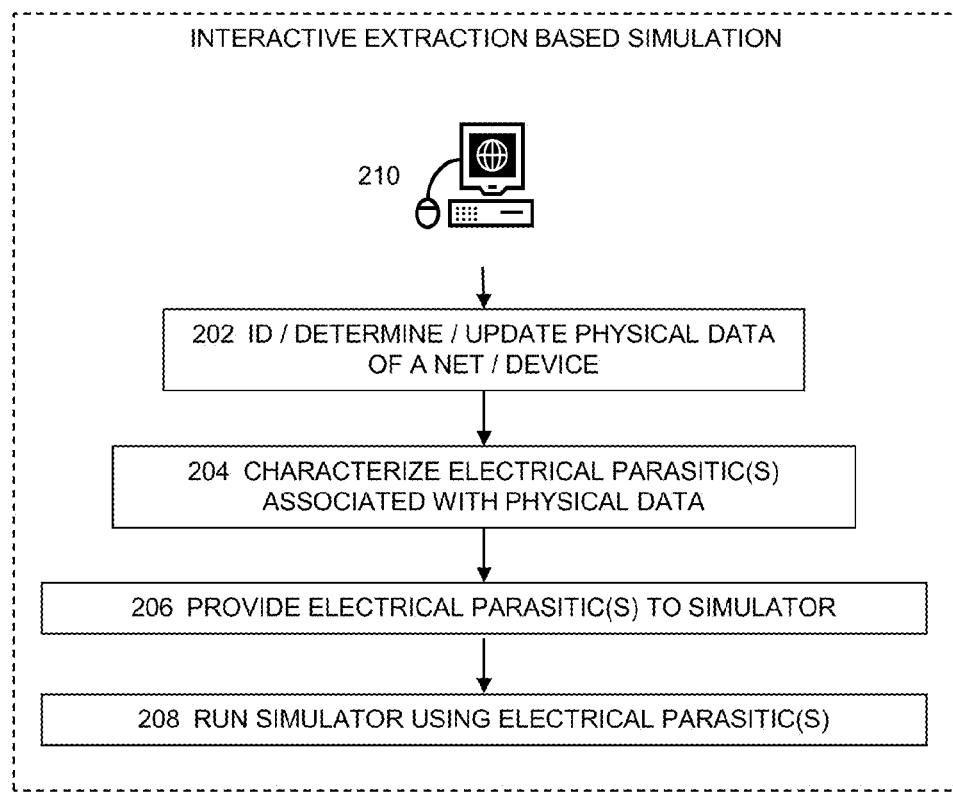
FIGS. 2A-B illustrate more detailed block diagrams for the method or system for implementing electronic circuit designs with electrical awareness in some embodiments.

FIG. 2A illustrates more detailed diagrams for the process or module for implementing electronic circuit designs with simulation awareness in some embodiments. The process or module for implementing electronic circuit designs with electrical awareness comprises the process or module for using a user interface of a computing node 210 for performing various actions in some embodiments. The process or module may also comprise the process or module for identifying, determining, or updating physical data of a net, a device, or a component (hereinafter "a component" collectively) of an electronic circuit physical design (202) in some embodiments.

In some embodiments, the process for identifying, determining, or updating physical data of a component of an electronic circuit physical design may be invoked from within a physical design tool or flow, such as a layout editor, while the designer is implementing or modifying the physical design of the electronic circuit rather than from a post-layout verification tool or flow in one or more embodiments. In some embodiments, device recognition and connectivity tasks are performed to able to map electrical characteristics such as current at a given terminal with the proper nets attached to that terminal. In some embodiments, connectivity can be directed to traverse the nets hierarchically and stop on levels determined by the user.

The process or module may further comprise the process or module 204 for characterizing an electrical parasitic that is associated with the physical data that are identified, determined, or updated at 202 in some embodiments. In some embodiments, the method or the system may also comprise the process or module for identifying, determining, or characterizing a device parameter that is associated with the component in the physical design at 202. In some embodiments, the method or the system may also comprise the process or module for identifying, determining, or characterizing an electrical parasitic or a device parameter that is associated with the component in the physical design at 202. In these embodiments, the electrical parasitic and the device parameter are collectively referred to as "electrical parasitic" or simply "parasitic".

In some embodiments, the characterization of electrical parasitics associated with physical data may be done with a two stage approach. This process begins with the selection a particular net or partial net. In the first stage, the process identifies where along that net that a geometric description should be created. The geometric descriptions may include wire widths and spacings, conductor and ILD (inter layer dielectrics) thicknesses, or thickness of barrier materials. A common description may be created and provided via an API (application programming interface.)

The second stage may include one or more components that may translate, transform, convert, or map (hereinafter "map") the geometric description to an equivalent parasitic value such as a resistance, capacitance or inductance. This translation, transformation, conversion, or mapping (hereinafter "mapping") may be done with mathematical algorithms or models that are often referred to as parasitic extraction. The models may be created through the use of semi-empirical methods that combine models or knowledge of the underlying physics with data provided by various solver(s), simulator(s), or a combination thereof. In some cases, the mapping for capacitance may also be done with a solver.

In some embodiments, the second stage may use parasitic extraction for some nets and a field solver for other nets. In some embodiments, the second stage may use a combination of parasitic extraction for, for example, resistance(s) and a field solver for, for example, capacitance(s) on the same net. In some embodiments, the characterization of electrical parasitics may be performed with extraction tools that map geometric dimensions and patterns to corresponding parasitics such as R, L, and C. In some embodiments, the characterization of electrical parasitics includes the use of field solvers (such as but not limited to one or more EM field solvers) that map geometric dimensions and patterns to capacitance(s).

In some embodiments, the process or module may further comprise the process or module for providing the electrical parasitic to a simulator (206), and a process or module 208 for performing one or more simulations using the provided electrical parasitic.

In one or more embodiments, the characterization of electrical parasitics, such as but not limited to various types of R, L, or C for one or more shapes that constitute a net, and the subsequent characterization of the electrical behavior or characteristic(s), such as but not limited to various types of currents, voltages, or current densities, as well as the checking or verification occur as a single net (or one or more shapes that are part of a net) has been created or modified but before the creation or modification of the next net or one or more shapes that are part of the next net. These characterizations or verification may also occur incrementally as a net is being created or modified in some embodiments. The simulation produced terminal currents may be used as one or more nets that connect to these terminals are being created or modified in some embodiments. In addition, these characterizations or verification may occur while there is only a partial layout in some embodiments. In these embodiments, the simulation, re-simulation, characterization, or verification of the electronic circuit design may be performed in conjunction with the creation or modification of the physical design of an electronic circuit design so that any impact of a circuit component is addressed before the physical design is completed.

Figure 2B:
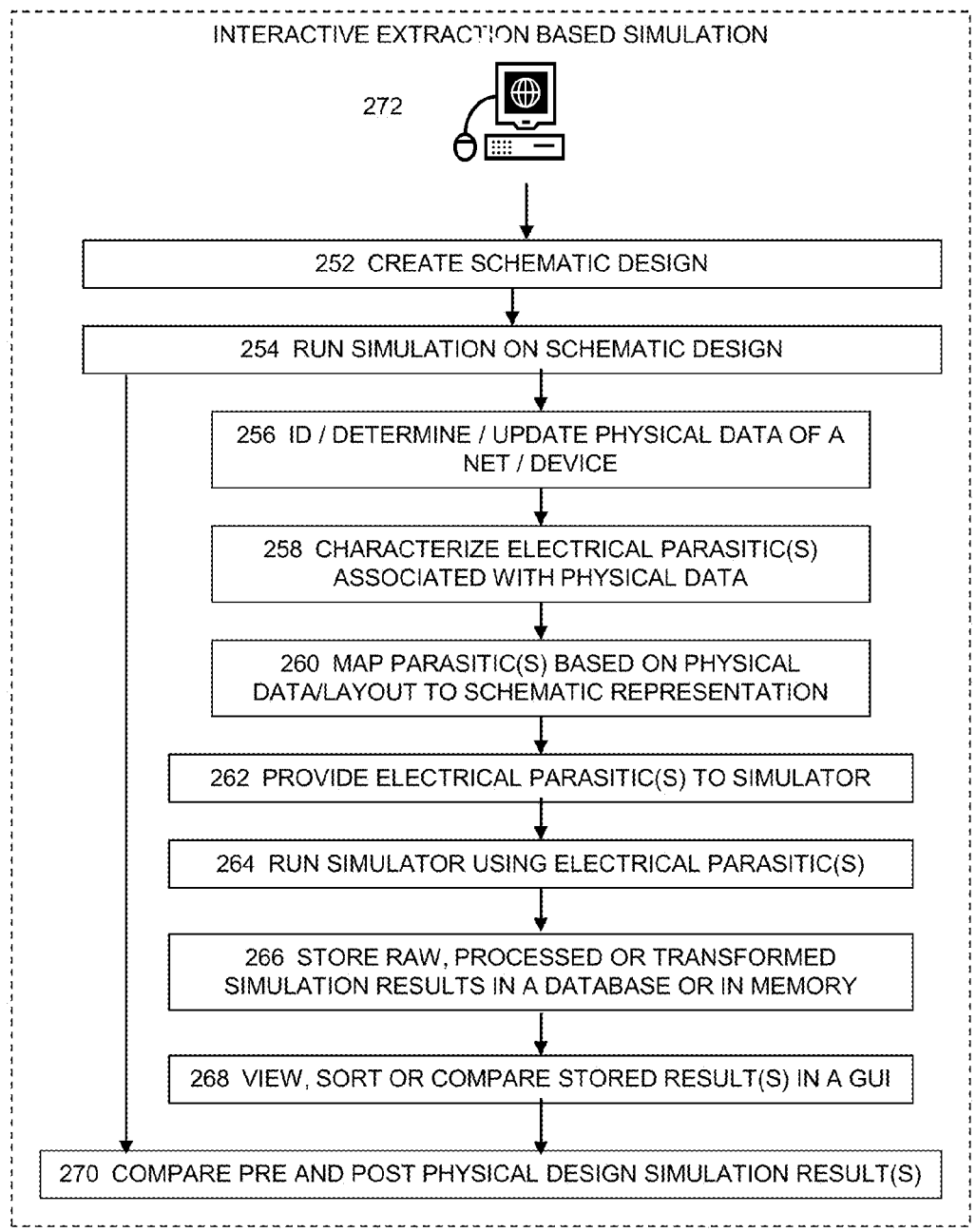

FIG. 2B illustrates more detailed diagrams for the process or module for implementing electronic circuit designs with simulation awareness in some embodiments. The process or module for implementing electronic circuit designs with electrical awareness comprises the process or module for using a user interface of a computing node 272 for performing various actions in some embodiments. The process or module may also comprise the process or module for identifying or creating a schematic design of an electronic circuit 252 in some embodiments. The process or module may also comprise the process or module for performing one or more simulations using the schematic design at 254 upon or shortly after the completion of the schematic design in some embodiments.

The process or module may also comprises the process or module for identifying, determining, or updating physical data of a net, a device, or a component (hereinafter "a component" collectively) of an electronic circuit physical design (256) in some embodiments. The process or module may further comprise the process or module 258 for characterizing an electrical parasitic that is associated with the physical data that are identified, determined, or updated at 256 in some embodiments.

The process or module may also comprises the process or module for mapping the electrical parasitic associated with the physical data or layout to a schematic representation at 260 in some embodiments. The process or module may also comprises the process or module for providing the electrical parasitic to a simulator at 262 in some embodiments. The process or module may also comprises the process or module for performing one or more simulations using at least the provided electrical parasitic at 264 in some embodiments. In some embodiments, the electrical parasitic data associated with the physical data is provided to a matrix solver for static or transient analysis. The matrix solver is run to produce voltage and current data for device and interconnect components of the design. In some embodiments, the method or system for implementing electronic circuit designs with simulation awareness comprises a flow where the simulator or solver is invoked after a single net has been created or modified.

In some embodiments, the simulation or re-simulation with electrical awareness may be performed during the schematic creation stage prior to physical design and may simply be stored for use during physical design. For example, the interconnect routing creates a net that connects a series of device terminals through multiple segments that direct the current from one or more terminals to one or more terminals. The terminal currents define the current coming into and out of a particular net, such as a signal net. In some embodiments, a solver may be used to estimate the currents and voltages through the physical data, e.g. wire segments, via or via clusters.

The solver or the simulator may be part of the physical design tool software or flow or work from the same physical design database to enable more interactive feedback as the physical design is created or modified. The currents through each section of the net may be combined with the geometry of the wire, for example width, or via to compute a current density.

Some embodiments use the electrical parasitics associated with physical design to re-simulate the design. In these embodiments, the electrical parasitics may need to be mapped to the schematic representation or stitched into the schematic. The parasitics may also be reduced a form that allows for faster simulation in some embodiments and retain additional capacitance values for nets where more simulation accuracy is desired.

For example, the electrical parasitics for one set of nets may have full sets of coupling capacitance values between nodes. One set may have only net to net coupling capacitances and other sets may only have the total cap and lump all coupling caps to ground. The simulation parameters such as temperature are matched with that used for extraction. The simulator provides parasitic aware set of electrical characteristics, such as voltages and currents, that are used for various checking or verification (such as but not limited to EM checking or IR-drop checking) in subsequent processes. One embodiment is where re-simulation of the layout parasitics is done in conjunction with various checking or verification and vice versa, so that any impact of a circuit component is addressed before the layout is completed.

More details about the process or module for implementing electronic circuit designs with simulation awareness are provided in U.S. application Ser. No. 12/982,790, entitled "METHODS, SYSTEMS, AND ARTICLES OF MANUFACTURE FOR IMPLEMENTING ELECTRONIC CIRCUIT DESIGNS WITH SIMULATION AWARENESS", the contents of which are hereby incorporated by reference in their entirety.

The process or module may also comprise the process or module for storing the raw, processed, or transformed simulation result(s) in a database or other types of data structure(s) in a non-transitory computer readable storage medium at 266 in some embodiments.

The process or module may also comprise the process or module for viewing, sorting, or comparing the stored simulation result(s) in a user interface at 268 in some embodiments. The process or module may also comprise the process or module for comparing the pre-physical design simulation result(s) with the post-physical design simulation result(s) at 270 directly after the process 254 is performed or the module 254 is invoked in some embodiments. More details about the process or module for implementing electronic circuit designs with simulation awareness are described in the related U.S. patent application Ser. No. 12/982,790, entitled "METHODS, SYSTEMS, AND ARTICLES OF MANUFACTURE FOR IMPLEMENTING ELECTRONIC CIRCUIT DESIGNS WITH SIMULATION AWARENESS", the contents of which are hereby incorporated in their entirety in this instant Application.

Figure 3A:
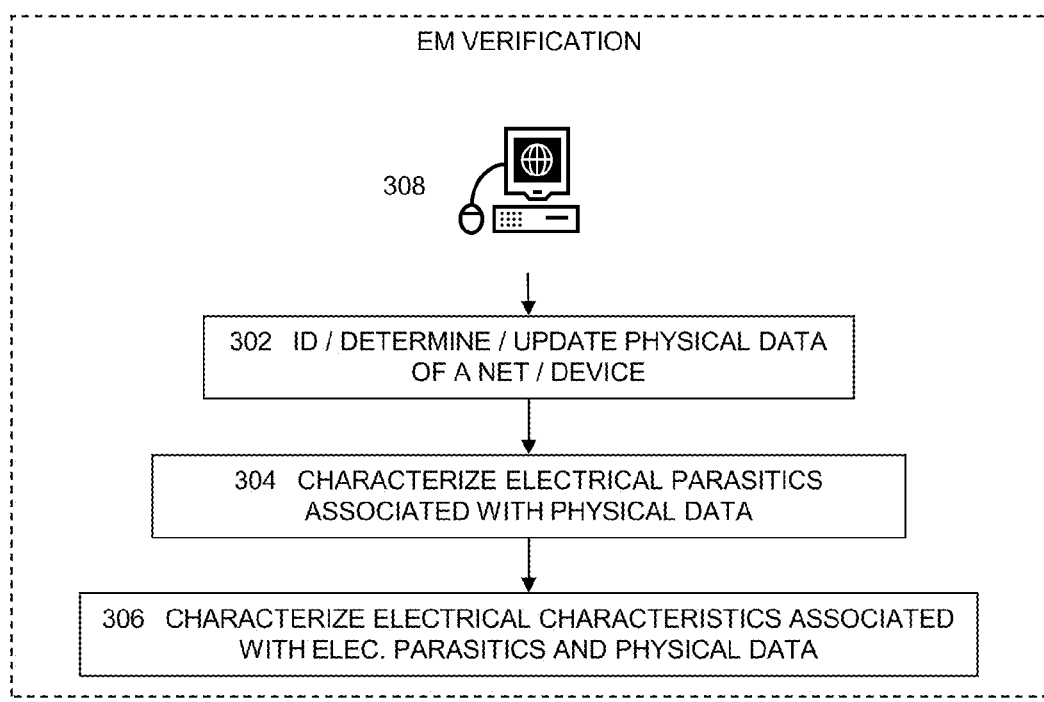
FIGS. 3A-B illustrate more details for the process or module for implementing electronic circuit designs with electrical awareness in some embodiments.

FIG. 3A illustrates more details for the process or module for implementing electronic circuit designs with electro-migration awareness in some embodiments. Modern ICs (integrated circuits) are more susceptible to wear-out over time (electro-migration or EM) due to current densities, which requires some degree of built-in fault-tolerance and a careful design planning. Meanwhile, increased power demanded on ever shrunk chip size causes higher current densities within the power routing. Uni-directional current flow in analog designs also requires tracking of current densities in signal nets as well. Higher currents and/or higher operating temperatures induce more significant EM effects in which metal lines begin to wear out during a chip's lifetime. In analog designs, uni-directional current flow and smaller wire geometries create EM concerns for the signal nets as well.

The process or module for implementing electronic circuit designs with electro-migration awareness comprises the process or module for using a user interface of a computing node 308 for performing various actions in some embodiments. The process or module may also comprise the process or module for identifying, determining, or updating physical data of a net, a device, or a component (hereinafter "a component" collectively) of an electronic circuit physical design (302) in some embodiments.

In some embodiments, the physical data may be related to a net, which comprises one or more wires or interconnects connecting various other components together in an electronic circuit design. In some embodiment, the physical data may be related to a single component in the physical design (e.g., a layout) of the electronic circuit. For example, the method or the system may be applied to determine whether an interconnect segment complies with one or more electro-migration related constraints. In this example, the physical data may comprise, for example, the width, the length, the cross-sectional area along the segment, overlap of a metal object and via object etc. In some embodiments where the component comprises a wire segment, the physical data for a wire segment may comprise the material (e.g., Copper, Aluminum, or Tungsten), one or more physical attributes, such as the thermal conductivity, surface boundary activation energy, etc. and/or one or more electrical attributes, such as the electrical conductance, Blech distance, or electrical resistivity.

In some embodiments, the physical data may be related to a device, which comprises a component that comprises a source and a drain. A device may comprise, for example, a field-effect transistor. In this example, the physical data may comprise the description of physical device layers and geometric descriptions that define the gate, source and drain regions. In various embodiments, the physical data may further comprise the material and its associated physical (e.g., physical or electrical) attributes. In various embodiments, the method or system may characterize shapes associated with a net and need to determine connectivity to identify one net from another.

In some embodiments, the process for identifying, determining, or updating physical data of a net, a device, or a component of an electronic circuit physical design are invoked from within a physical design tool or flow, such as a layout editor, while the designer is implementing or modifying the physical design of the electronic circuit rather than from a post-layout verification tool or flow. In some embodiments, device recognition and connectivity tasks are performed to able to map electrical characteristics such as current at a given terminal with the proper nets attached to that terminal. In some embodiments, connectivity can be directed to traverse the nets hierarchically and stop on levels determined by the user.

The process or module may further comprise the process or module 304 for characterizing an electrical parasitic that is associated with the physical data that are identified, determined, or updated at 302 in some embodiments. In some embodiments, the process or module may further comprise the process or module for providing the electrical parasitic to a simulator, and a process or module 306 for characterizing the electrical characteristic that is associated with the parasitic and/or the physical data.

In some embodiments, the electrical parasitic comprises resistance, self- or coupled-inductance, or capacitance that is associated with the physical data. In the example of an interconnect segment in a physical design, the method or the system may characterize the resistance of this particular interconnect segment by using the electrical resistivity, the length of the segment, and the cross-sectional area along the segment. In some embodiments, the system monitors and tracks the relevant physical data associated with the creation or change to the design, for example the creation of a net or the widening of a wire segment in a net.

Resistance and capacitance models may be applied automatically to compute the parasitic data in some embodiments. Thus, parasitics may be generated interactively as physical design objects have been or are being created or modified. The set of partial design objects, including a set of one or more objects in the electronic circuit design that is interactively analyzed, may form a partial layout in some embodiments. In various embodiments, a partial layout comprises zero or more physical design objects and thus does not pass a layout versus schematic (LVS) check or verification. The results of various characterization processes or modules may be stored for use with subsequent electrical analysis processes or may additionally be displayed in parasitic form(s) in one or more embodiments.

The simulation produced terminal currents may be used as one or more nets that connect to these terminals are being created or modified in some embodiments. In addition, these characterization(s) or verification(s) may occur while there is only a partial layout in some embodiments. In these embodiments, the simulation, re-simulation, characterization, or verification of the electrical parasitics may be performed in conjunction with the creation or modification of the physical design of an electronic circuit design so that any impact of a circuit component is addressed before the physical design is completed.

In one or more embodiments, the characterization of parasitics such as but not limited to various types of R, L, or C for one or more shapes that constitute a net and the subsequent characterization of the electrical behavior or characteristic(s), such as but not limited to various types of currents, voltages, or current densities, as well as the constraint verification occur as a single net (or one or more shapes that are part of a net) has been created or modified but before the creation or modification of the next net or one or more shapes that are part of the next net. These characterizations or verification may also occur incrementally as a net is being created or modified in some embodiments. The simulation produced terminal currents may be used as one or more nets that connect to these terminals are being created or modified in some embodiments. In addition or in the alternative, these characterizations or verification may occur while there is only a partial layout in some embodiments. In these embodiments, the simulation, re-simulation, characterization, or verification of the electrical parasitics may be performed in conjunction with the creation or modification of the physical design of an electronic circuit design so that any impact of a circuit component is addressed before the physical design is completed.

More details about the process or module for implementing electronic circuit designs with EM awareness are described in the related U.S. patent application Ser. No. 12/982,762, entitled "METHODS, SYSTEMS, AND ARTICLES OF MANUFACTURE FOR IMPLEMENTING ELECTRONIC CIRCUIT DESIGNS WITH ELECTRO-MIGRATION AWARENESS", the contents of which are hereby expressly incorporated in their entirety.

Figure 3B:
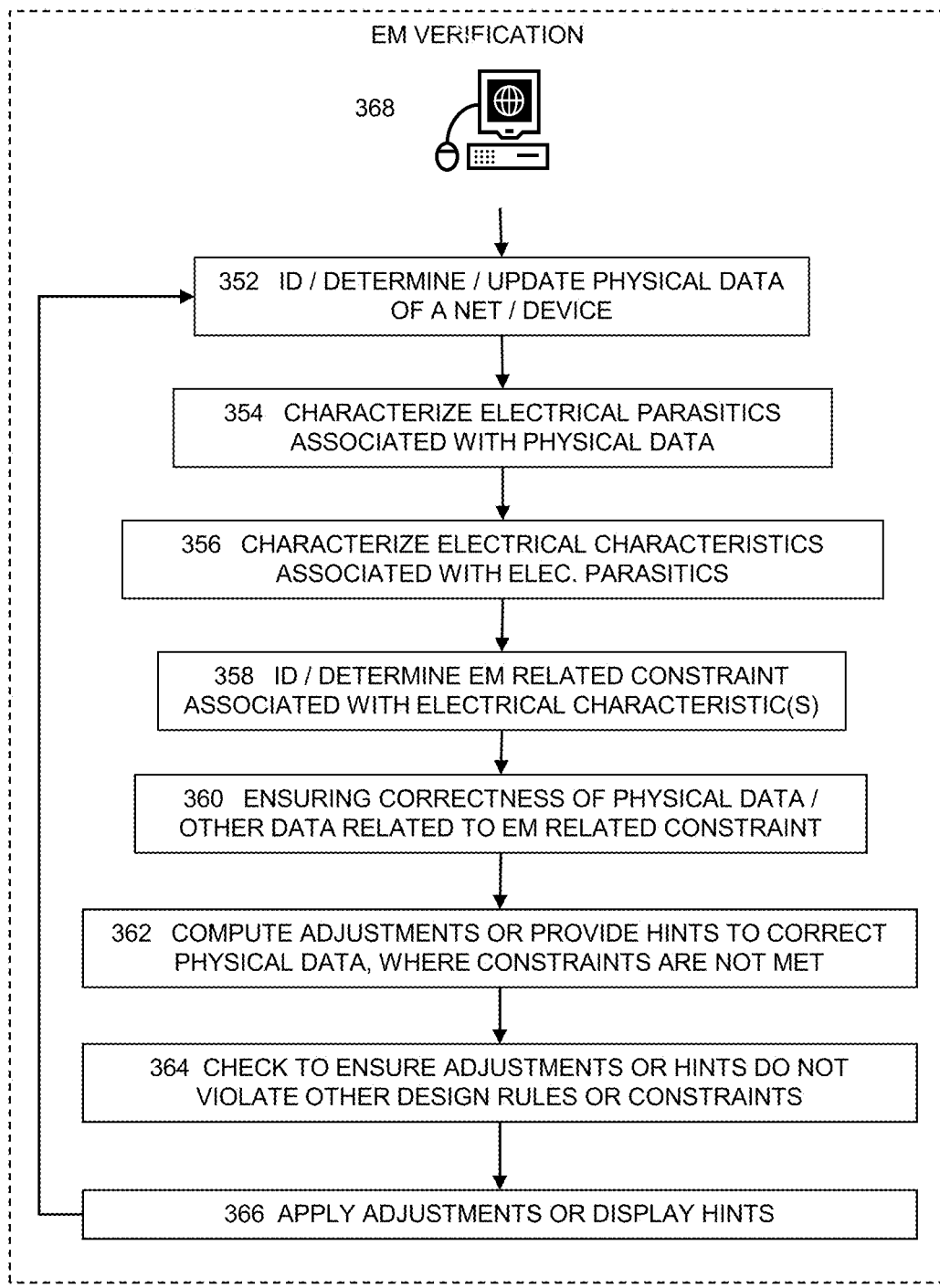

FIG. 3B illustrates more detailed diagrams for the process or module for implementing electronic circuit designs with electro-migration awareness in some embodiments. The process or module for implementing electronic circuit designs with electro-migration awareness comprises the process or module for using a user interface of a computing node 368 for performing various actions in some embodiments. The process or module may also comprise the process or module for identifying, determining, or updating the physical data of a net, a device, or a component of the electronic circuit design at the physical level at 352 in some embodiments. The process or module may also comprise the process or module for characterizing the electrical parasitic that is associated with the physical data at 354 in some embodiments.

In some embodiments, the process or module for implementing electronic circuit designs with electro-migration awareness may further comprise the process or module of characterizing the electrical characteristic that is associated with the electrical parasitic at 356. In some embodiments, the process or module for implementing electronic circuit designs with electro-migration (EM) awareness may further comprise the process or module of identifying or determining an EM related constraint that is associated with the electrical characteristic at 358. In some embodiments, the process or module for implementing electronic circuit designs with electro-migration awareness may further comprise the process or module of ensuring correctness of the physical data or other data related to the EM related constraint at 360.

In some embodiments, the process or module for implementing electronic circuit designs with electro-migration awareness may further comprise the process or module of computing or determining one or more adjustments or providing one or more hints to correct the physical data at 362 in these embodiments where the EM related constraint is not met. In some embodiments, the process or module for implementing electronic circuit designs with electro-migration awareness may further comprise the process or module of checking or determining to ensure that the one or more adjustments computed or determined at 362 do not violate other design rules, constraints, or requirements at 364. In some embodiments, the process or module for implementing electronic circuit designs with electro-migration awareness may further comprise the process or module of applying at least some of the one or more adjustments to fix the physical data or displaying the one or more hints to the user at 366. In some embodiments, the process or module of applying at least some of the one or more adjustments is performed as a part of a placement process or a routing process or is invoked as a part of the placement module or the routing module. In some embodiments after the process 366 is performed or the module 366 is invoked, the process or module for implementing electronic circuit designs with electro-migration awareness may loop back to 352 to further identify, determine, or update the physical data or additional physical data and repeats the processes or modules as described above until satisfactory results are obtained.

More details about the process or module for implementing electronic circuit designs with electro-migration awareness are further described in U.S. patent application Ser. No. 12/982,762, entitled "METHODS, SYSTEMS, AND ARTICLES OF MANUFACTURE FOR IMPLEMENTING ELECTRONIC CIRCUIT DESIGNS WITH ELECTRO-MIGRATION AWARENESS", the contents of which are hereby expressly incorporated by reference in their entirety in this instant Application.

Figure 4A:
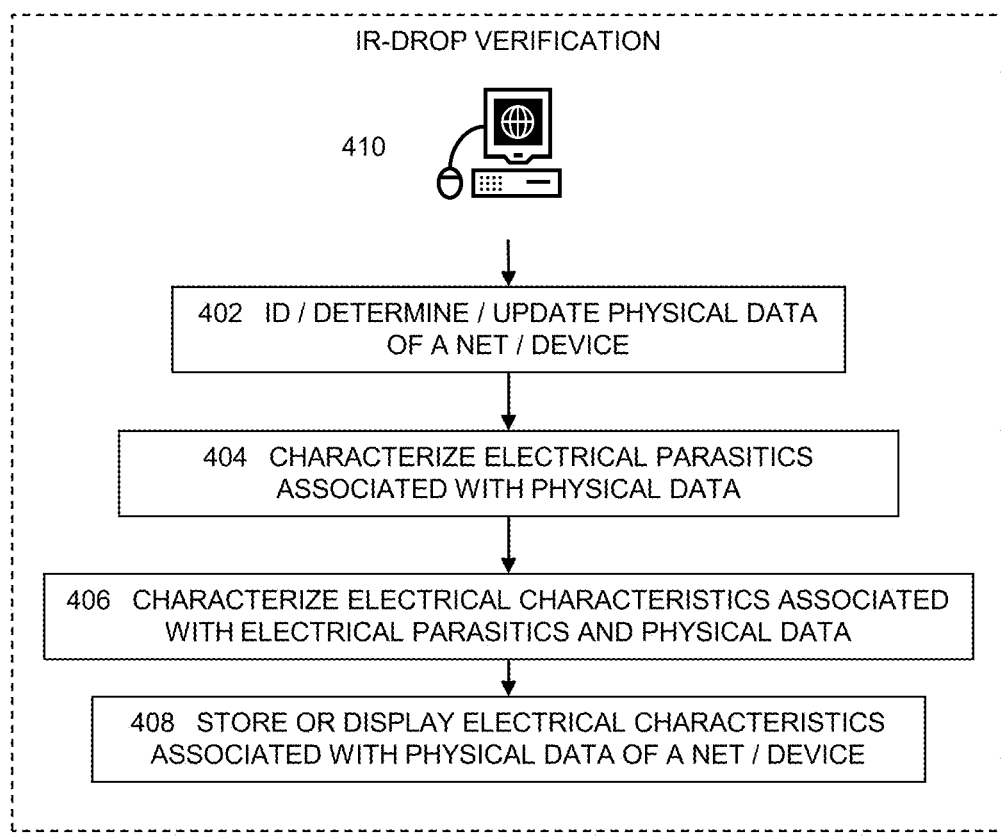
FIGS. 4A-B illustrate more details for the process or module for implementing electronic circuit designs with electrical awareness in some embodiments.

FIG. 4A illustrates more details for the process or module for implementing electronic circuit designs with IR-drop awareness in some embodiments. The process or module for implementing electronic circuit designs with IR-drop awareness comprises the process or module for using a user interface of a computing node 410 for performing various actions in some embodiments. The process or module may also comprise the process or module for identifying, determining, or updating the physical data of a net, a device, or a component of the electronic circuit design at the physical level at 402 in some embodiments.

In some embodiments, the process for identifying, determining, or updating physical data of a component of an electronic circuit physical design may be invoked from within a physical design tool or flow, such as a layout editor, while the designer is implementing or modifying the physical design of the electronic circuit rather than from a post-layout verification tool or flow. In some embodiments, device recognition and connectivity tasks are performed to able to map electrical characteristics such as current at a given terminal with the proper nets attached to that terminal. In some embodiments, connectivity can be directed to traverse the nets hierarchically and stop on levels determined by the user.

The process or module may also comprise the process or module for characterizing the electrical parasitic that is associated with the physical data at 404 in some embodiments. The process or module may also comprise the process or module for characterizing the electrical characteristic that is associated with the electrical parasitic and/or the physical data at 406 in some embodiments. The process or module may also comprise the process or module for storing the electrical characteristic associated with the electrical parasitic or the physical data in a non-transitory computer readable storage medium or displaying the electrical characteristic or other related data on a display apparatus at 408 in some embodiments.

In one or more embodiments, the characterization of parasitics such as but not limited to various types of R, L or C for shapes that constitute a net at 404 and the subsequent characterization of the electrical behavior or characteristic(s), such as but not limited to various types of currents, voltages, or current densities at 406 occur as a net (or one or more shapes that are part of a net) is created or modified but before the creation or modification of the next net or one or more shapes that are part of the next net. This characterization may occur incrementally as each net is being created or modified and may occur while there is only a partial layout in some embodiments. The simulation produced terminal currents may be used as one or more nets that connect to these terminals are being created or modified in some embodiments.

Figure 4B:
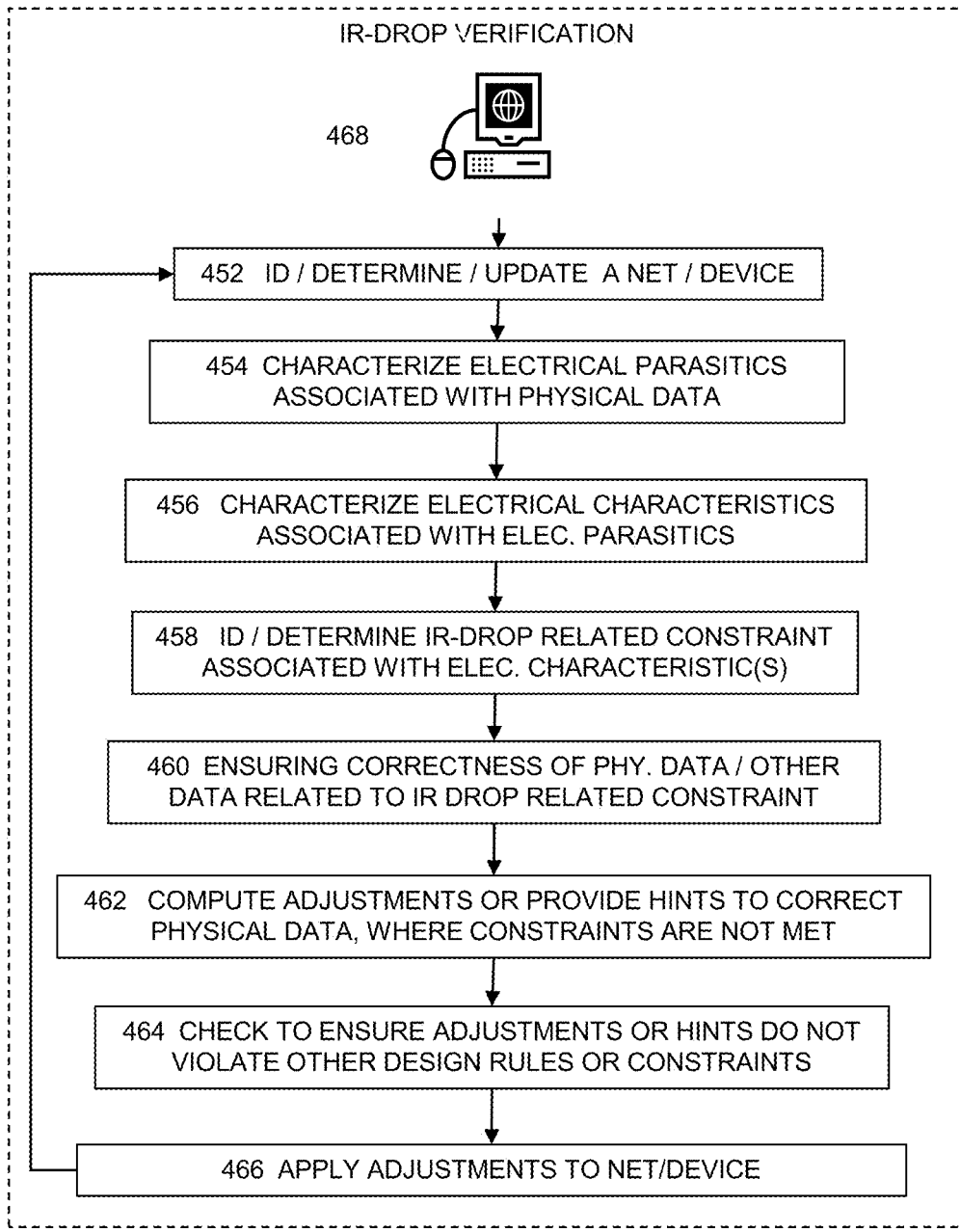

FIG. 4B illustrates more details for the process or module for implementing electronic circuit designs with IR-drop awareness in some embodiments. The process or module for implementing electronic circuit designs with IR-drop awareness comprises the process or module for using a user interface of a computing node 468 for performing various actions in some embodiments. The process or module may also comprise the process or module for identifying, determining, or updating the physical data of a net, a device, or a component of the electronic circuit design at the physical level at 454 in some embodiments.

In some embodiments, the process or module for implementing electronic circuit designs with electro-migration awareness may further comprise the process or module of characterizing the electrical characteristic that is associated with the electrical parasitic at 456. In some embodiments, the process or module for implementing electronic circuit designs with IR-drop awareness may further comprise the process or module of identifying or determining an IR-drop related constraint that is associated with the electrical characteristic at 458. In some embodiments, the process or module for implementing electronic circuit designs with IR-drop awareness may further comprise the process or module of ensuring correctness of the physical data or other data related to the IR-drop related constraint at 460.

In some embodiments, the process or module for implementing electronic circuit designs with IR-drop awareness may further comprise the process or module of computing or determining one or more adjustments or providing one or more hints to correct the physical data at 462 in these embodiments where the IR-drop related constraint is not met. In some embodiments, the process or module for implementing electronic circuit deigns with IR-drop awareness may further comprise the process or module of checking or determining to ensure that the one or more adjustments computed or determined at 462 do not violate other design rules, constraints, or requirements at 464.

In some embodiments, the process or module for implementing electronic circuit designs with IR-drop awareness may further comprise the process or module of applying at least some of the one or more adjustments to fix the physical data or displaying the one or more hints to the user at 466. In some embodiments after the process 366 is performed or the module 466 is invoked, the process or module for implementing electronic circuit designs with IR-drop awareness may loop back to 452 to further identify, determine, or update the physical data or additional physical data and repeats the processes or modules as described above until satisfactory results are obtained.

More details about the process or module for implementing electronic circuit designs with IR-drop awareness are further described in U.S. Provisional App. Ser. No. 61/367,406, entitled "METHODS, SYSTEMS, AND ARTICLES OF MANUFACTURES FOR IMPLEMENTING ELECTRONIC CIRCUIT DESIGNS WITH IR-DROP AWARENESS" and filed on Jul. 24, 2010, the contents of which are hereby incorporated by reference in their entirety in this instant application.

Figure 5:
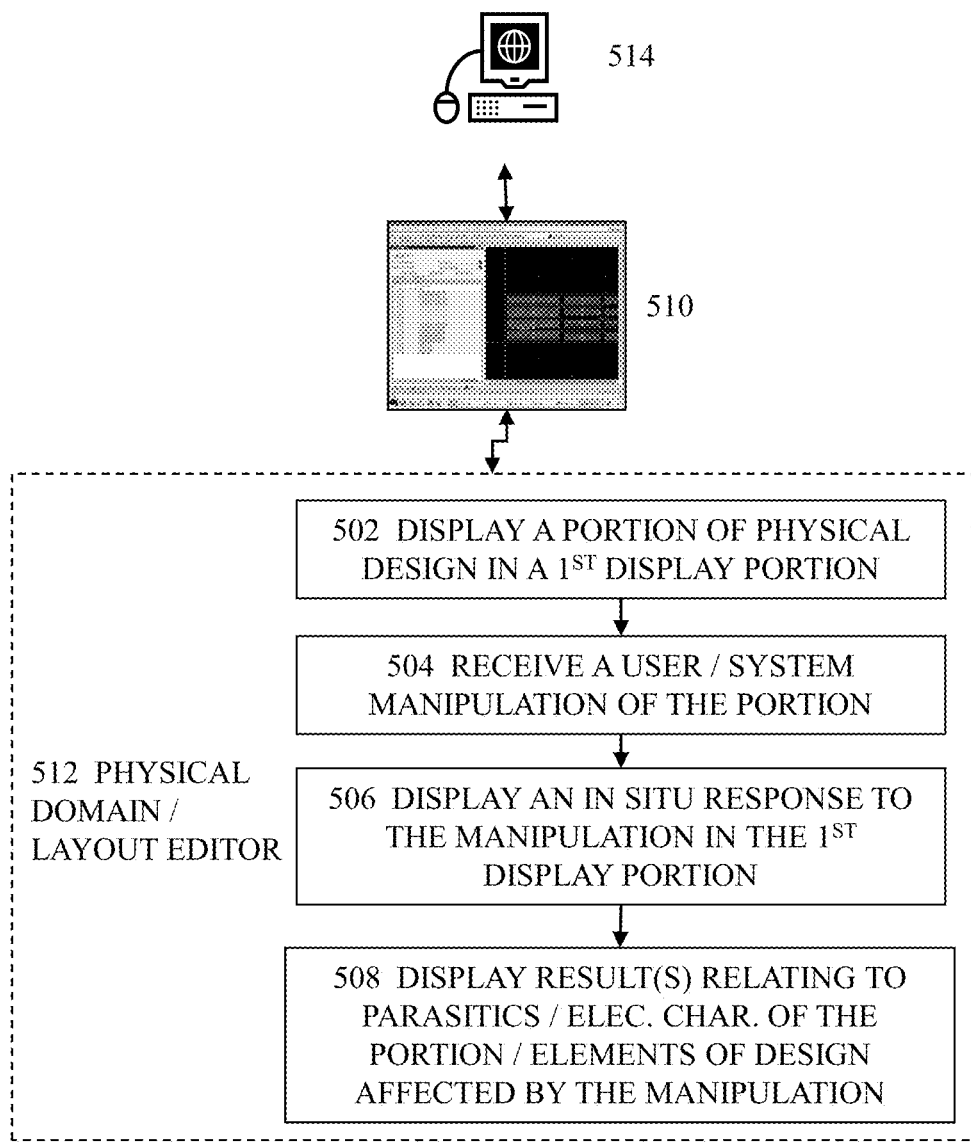
FIG. 5 illustrates more details for the process or module for implementing electronic circuit designs with electrical awareness in some embodiments.

FIG. 5 illustrates more details for the process or module for providing in situ, customizable information for implementing electronic circuit designs with electrical awareness in some embodiments. The process or module for providing in situ, customizable information in a user interface 510 of a computing node 514 for implementing electronic circuit designs with electrical awareness may comprise the process or module of displaying a portion of a physical design in a first display portion of the user interface at 502 in some embodiments. The process or module for providing in situ, customizable information in a user interface may further comprise the process or module of receiving a user's or a system's manipulation of the portion of the physical design at 504 in some embodiments.

The process or module for providing in situ, customizable information in a user interface may further comprise the process or module of determining and displaying an in situ, customizable response to the manipulation in the first display portion at 506 in some embodiments. The process or module for providing in situ, customizable information in a user interface may further comprise the process or module of displaying one or more results relating to the electrical parasitic(s), the electrical characteristic(s), and/or the physical data of the portion of the physical design or other elements of the design that are affected by the manipulation at 508 in some embodiments. In some embodiments, the user interface 510 comprises a graphical user interface for a physical domain electronic circuit design tool or a circuit layout editor 512.

More details about the process or module for providing in situ, customizable information for implementing electronic circuit designs with electrical awareness are further described in U.S. patent application Ser. No. 12/982,628, entitled "METHOD, APPARATUS, AND ARTICLE OF MANUFACTURE FOR PROVIDING IN SITU, CUSTOMIZABLE INFORMATION IN DESIGNING ELECTRONIC CIRCUITS WITH ELECTRICAL AWARENESS", the contents of which are hereby incorporated by reference in their entirety in this instant Application.

Figure 6A:
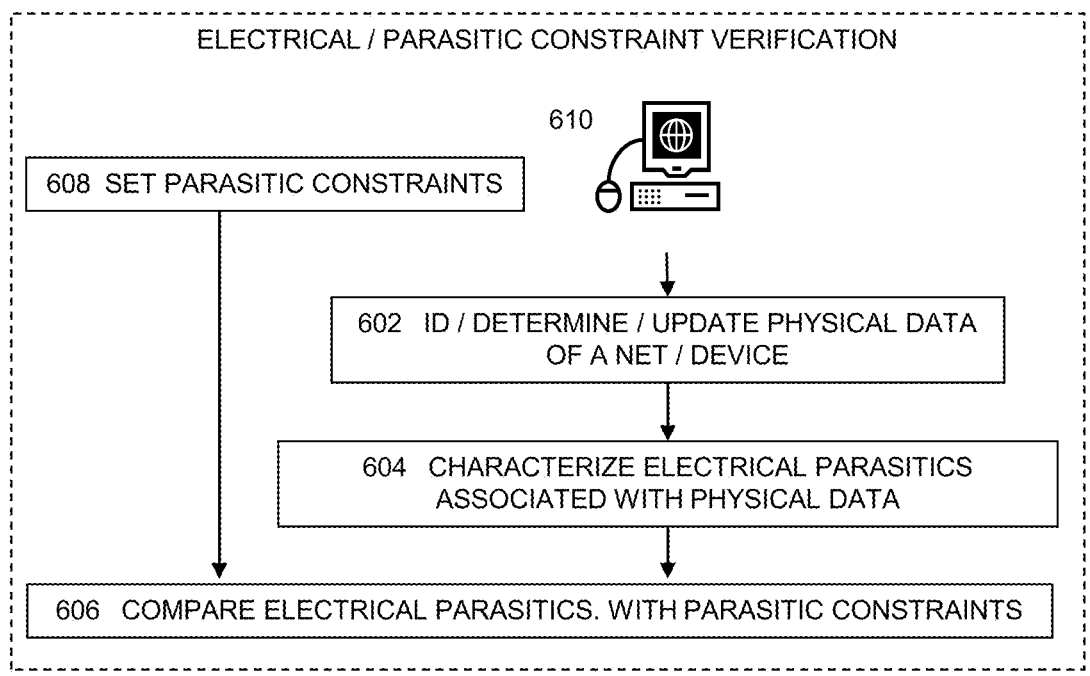
FIGS. 6A-B illustrate more details for the process or module for constraint verification for implementing electronic circuit design with electrical awareness in some embodiments.

FIG. 6A illustrates more details for the process or module for constraint verification for implementing electronic circuit design with electrical awareness in some embodiments. The process or module for constraint verification for implementing electronic circuit designs with electrical awareness may further comprise the process or module of using a user interface of a computing node 610 for performing various actions in some embodiments. The process or module for constraint verification for implementing electronic circuit designs with electrical awareness may also comprise the process or module for identifying, determining, or updating physical data of a net, a device, or a component of an electronic circuit physical design at 602 in some embodiments.

The process or module may further comprise the process or module for characterizing an electrical parasitic that is associated with the physical data of the component at 604 in some embodiments. The process or module may further comprise the process or module for comparing the electrical parasitic with one or more corresponding parasitic constraints at 606 after the electrical parasitic is characterized at 604 in some embodiments. The process or module may further comprise the process or module for identifying or receiving a parasitic from, for example, a user at 608 in some embodiments. After the parasitic constraint is received or identified at 608, the process or module may proceed to 606 to compare the electrical parasitic that is characterized at 604 with the parasitic constraint that is received or identified at 608 in some embodiments.

In one or more embodiments, the characterization of parasitics such as but not limited to various types of R, L, or C for one or more shapes that constitute a net and the subsequent characterization of the electrical behavior or characteristic(s), such as but not limited to various types of currents, voltages, or current densities, as well as the constraint verification occur as a single net (or one or more shapes that are part of a net) has been created or modified but before the creation or modification of the next net or one or more shapes that are part of the next net. These characterizations or verification may also occur incrementally as a net is being created or modified in some embodiments. The simulation produced terminal currents may be used as one or more nets that connect to these terminals are being created or modified in some embodiments. In addition, these characterizations or verification may occur while there is only a partial layout in some embodiments. In these embodiments, the simulation, re-simulation, characterization, or verification of the electrical parasitics may be performed in conjunction with the creation or modification of the physical design of an electronic circuit design so that any impact of a circuit component is addressed before the physical design is completed.

Figure 6B:
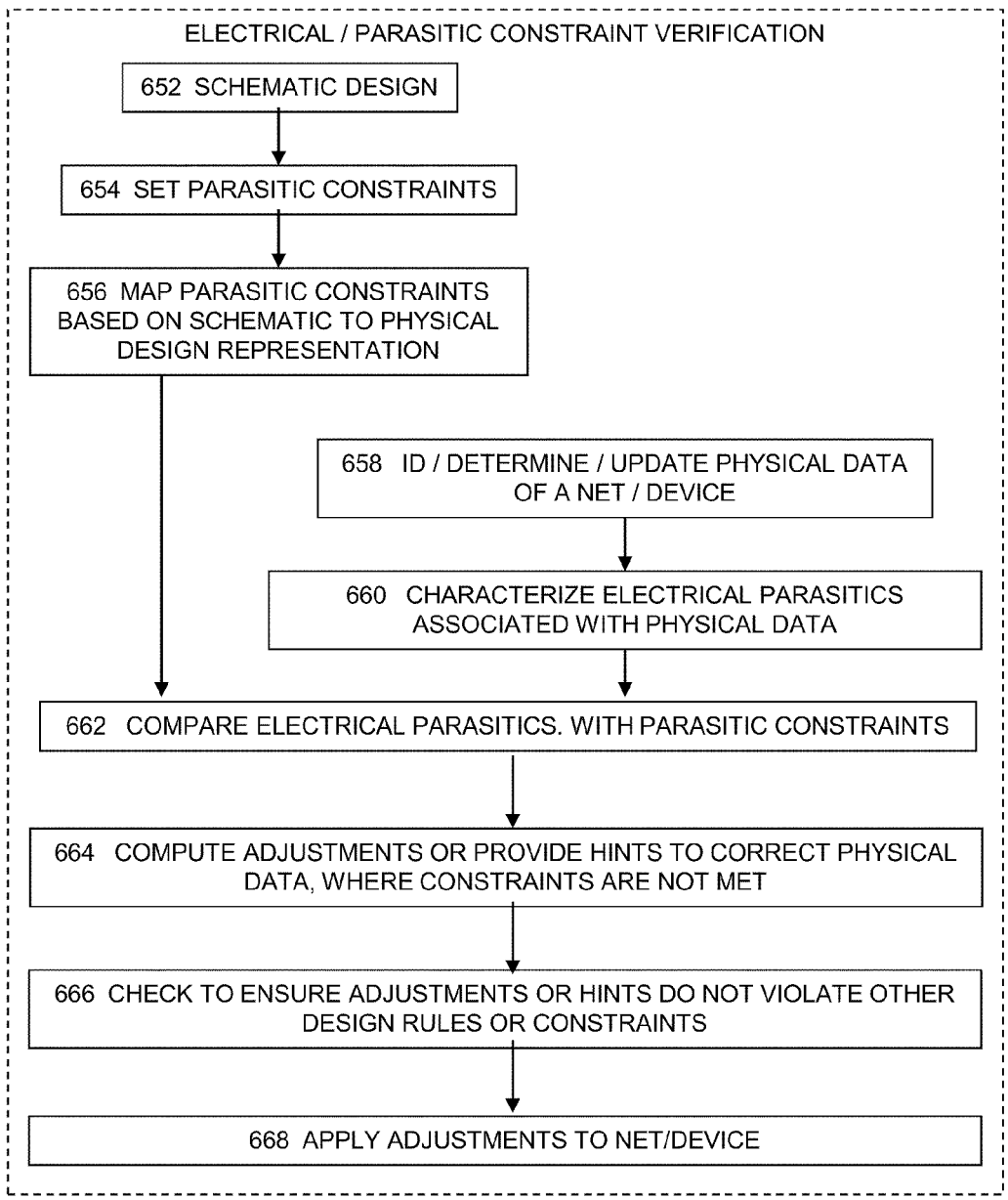

FIG. 6B illustrates more details for the process or module for constraint verification for implementing electronic circuit design with electrical awareness in some embodiments. The process or module for constraint verification for implementing electronic circuit design with electrical awareness may comprise the process or module of identifying or creating a schematic design at 652 in some embodiments. The process or module for constraint verification for implementing electronic circuit designs with electrical awareness may further comprise the process or module for identifying or receiving a parasitic constraint at 654 in some embodiments. The process or module for constraint verification for implementing electronic circuit designs with electrical awareness may further comprise the process or module for mapping the parasitic constraint at 656 based at least in part upon the schematic to physical design representation in some embodiments.

The process or module for constraint verification for implementing electronic circuit designs with electrical awareness may further comprise the process or module for identifying, determining, or updating physical data of a net, a device, or a component of an electronic circuit physical design at 658 in some embodiments. The process or module may also comprise the process or module for characterizing the electrical parasitic associated with the physical data at 660 in some embodiments. After the process or module 660 or the process or module 656, the process or module may also proceed to compare the electrical parasitic with the parasitic constraint at 662 in some embodiments.

The process or module may also comprise the process or module for computing one or more adjustments or providing one or more hints to correct the physical data at 664 in some embodiments where the parasitic constraint is not met. The process or module may further comprise the process or module for determining or checking to ensure the one or more adjustments or the one or more hints do not violate other constraints, design rules, or requirements at 666 in some embodiments. The process or module may further comprise the process or module for applying at least one of the one or more adjustments to the component with which the physical data are associated at 668.

More details about the process or module for constraint verification for implementing electronic circuit designs with electrical awareness are further described in U.S. patent application Ser. No. 12/982,732, entitled "METHODS, SYSTEMS, AND ARTICLES OF MANUFACTURE FOR CONSTRAINT VERIFICATION FOR IMPLEMENTING ELECTRONIC CIRCUIT DESIGNS WITH ELECTRICAL AWARENESS", the contents of which are hereby incorporated by reference in their entirety in this instant Application.

System Architecture Overview

Figure 7:
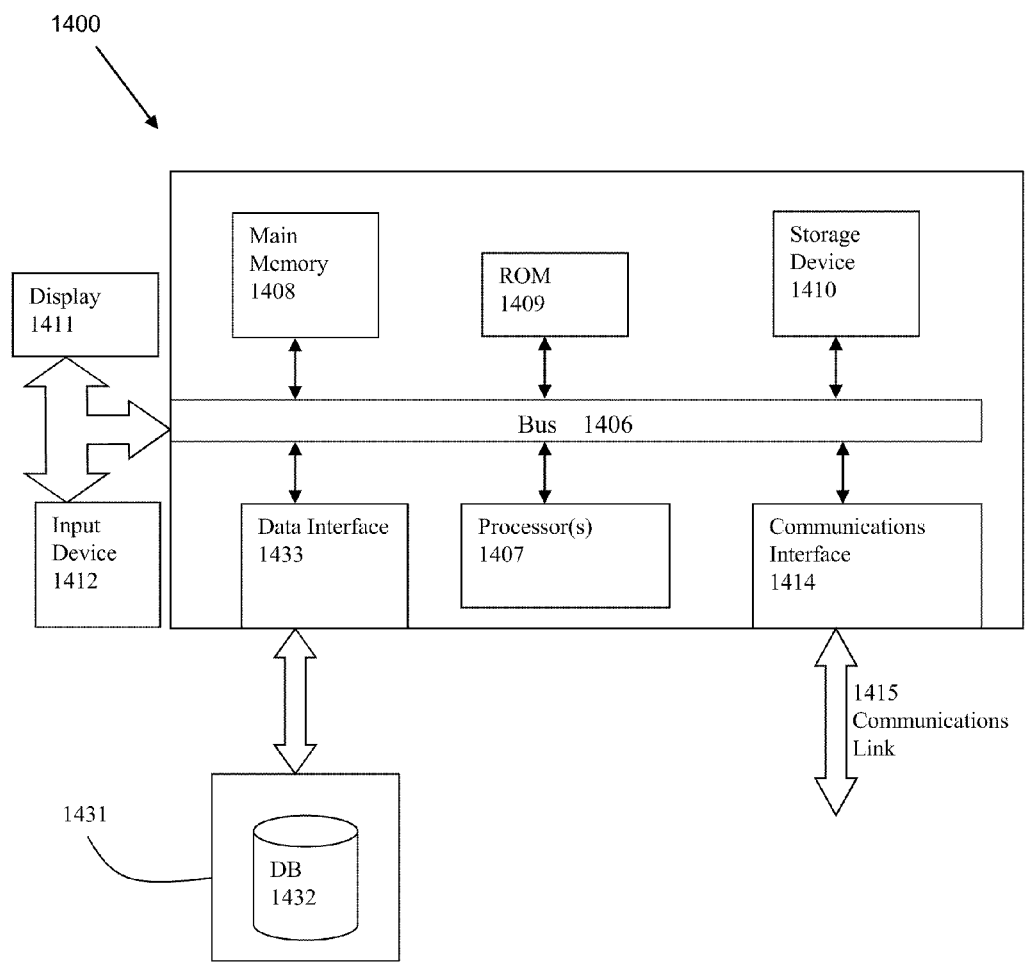
FIG. 7 depicts a computerized system on which a method for implementing electronic circuit designs with electrical awareness can be implemented in some embodiments.

FIG. 7 illustrates a block diagram of an illustrative computing system 1400 suitable for implementing some embodiments of the method or system for implementing electronic circuit designs with electrical awareness as described in the preceding paragraphs with reference to various figures. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control (not shown).

According to one embodiment, computer system 1400 performs specific operations by one or more processor or processor cores 1407 executing one or more sequences of one or more instructions contained in system memory 1408. Such instructions may be read into system memory 1408 from another computer readable/usable storage medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 1407, where the one or more processors, one or more processor cores, or combination thereof executes one or more threads. For example, the act of specifying various net or terminal sets or the act or module of performing verification or simulation, etc. may be performed by one or more processors, one or more processor cores, or combination thereof.

The term "computer readable storage medium" or "computer usable storage medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution. In an embodiment, the computer system 1400 operates in conjunction with a data storage system 1431, e.g., a data storage system 1431 that contains a database 1432 that is readily accessible by the computer system 1400. The computer system 1400 communicates with the data storage system 1431 through a data interface 1433. A data interface 1433, which is coupled to the bus 1406, transmits and receives electrical, electromagnetic or optical signals that include data streams representing various types of signal information, e.g., instructions, messages and data. In embodiments of the invention, the functions of the data interface 1433 may be performed by the communication interface 1414.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer implemented method for implementing an electronic circuit design with electrical awareness, comprising:
    using at least one processor that is programmed for performing a process that comprises:
        identifying, determining, or updating physical data of a component that is situated along a partial, incomplete net in a partial, incomplete physical design of the electronic circuit design, wherein the partial, incomplete physical design fails to pass a layout versus schematic check;
        characterizing an electrical parasitic that is caused by or determined from at least a physical characteristic of the component in the physical data; and
        characterizing an electrical characteristic of the electrical parasitic by performing a simulation with the electrical parasitic prior to completing the partial, incomplete physical design of the electronic circuit design.

2. The computer implemented of claim 1, the process further comprising:
    ensuring correctness of the physical data or other data related to the electrical parasitic or the electrical characteristic.

3. The computer implemented method of claim 2, wherein the act of ensuring the correctness comprises:
    performing an extraction based simulation.

4. The computer implemented method of claim 3, wherein the act of performing the extraction based simulation comprises:
    identifying or creating a schematic design for at least a portion of the electronic circuit; and
    performing a simulation on the schematic design.

5. The computer implemented method of claim 4, the process further comprising:
    mapping the electrical parasitic to a schematic representation; and
    providing the schematic representation to a simulator to re-perform the simulation on the schematic design.

6. The computer implemented method of claim 5, the process further comprising:
    comparing a pre-physical design simulation result with a post-simulation result.

7. The computer implemented method of claim 1, wherein the act of characterizing the electrical parasitic comprises:
    performing an electro-migration or an IR-drop analysis.

8. The computer implemented method of claim 7, wherein the act of characterizing the electrical characteristic comprises:
    determining the electrical characteristic using at least a result of the electro-migration or the IR-drop analysis.

9. The computer implemented method of claim 7, wherein the act of ensuring the correctness comprises:
    determining whether the electrical characteristic meets an electro-migration related or an IR-drop related constraint.

10. The computer implemented method of claim 1, the process further comprising:
    determining a hint based at least in part upon a result of the act of ensuring the correctness of the physical data or the other data; and
    displaying the hint in a user interface on a display apparatus.

11. The computer implemented method of claim 10, the process further comprising:
    determining whether the adjustment causes one or more violations of one or more design rules or one or more constraints.

12. The computer implemented method of claim 1, the process further comprising:
    determining an adjustment based at least in part upon a result of the act of ensuring the correctness of the physical data or the other data; and
    applying the adjustment to the physical data or to the other data related to the electrical parasitic or the electrical characteristic.

13. The computer implemented method of claim 12, in which the action of applying the adjustment to the physical data is performed as a part of a placement of one or more devices or a part of a routing process.

14. The computer implemented method of claim 1, the process further comprising:
    providing an in situ, customizable information in a user interface.

15. The computer implemented method of claim 14, the act of providing the in situ, customizable information comprising:
    displaying a portion of a physical design in a first display portion of an user interface on a display apparatus;
    receiving a manipulation of the portion of the physical design; and determining and displaying a response to the manipulation in the first display portion.

16. The computer implemented method of claim 1, in which the partial physical design does not pass a layout versus schematic check or verification.

17. The computer implemented method of claim 1, in which the act of characterizing the electrical parasitic or the act of characterizing the electrical characteristic is performed before or at a time of completing creation of a net or modification of an existing net.

18. The computer implemented method of claim 1, the process further comprising:
verifying the electrical characteristic after completion of creation or modification of a net or a partial net and before creation or modification of a second net in the partial physical design.

19. The computer implemented method of claim 1, in which the act of characterizing the electrical parasitic or the act of characterizing the electrical characteristic is performed based at least in part upon a shape or a set of shapes on a net at a time when the net is created or completed.

20. A system for implementing an electronic circuit design with electrical awareness, comprising:
at least one processor that is at least to:
identify, determine, or update physical data of a component that is situated along a partial, incomplete net in a partial, incomplete physical design of the electronic circuit design, wherein the partial, incomplete physical design fails to pass a layout versus schematic check;
characterize an electrical parasitic that is caused by or determined from at least a physical characteristic of the component in the physical data; and
characterize an electrical characteristic of the electrical parasitic by performing a simulation with the electrical parasitic prior to completing the partial, incomplete physical design of the electronic circuit design.

21. The system of claim 20, in which the at least one processor is further at least to:
ensure correctness of the physical data or other data related to the electrical parasitic or the electrical characteristic, in which the at least one processor that is to ensure the correctness of the physical data or other data is further to:
perform an extraction based simulation, wherein the at least one processor that is to perform the extraction is further to:
identify or create a schematic design for at least a portion of the electronic circuit; and
perform a simulation on the schematic design;
map the electrical parasitic to a schematic representation; and
provide the schematic representation to a simulator to re-perform the simulation on the schematic design.

22. The system of claim 20, wherein the at one processor is further to:
determine a hint based at least in part upon a result of the act of ensuring the correctness of the physical data or the other data; and
display the hint in a user interface on a display apparatus.

23. The system of claim 20, wherein the at one processor is further to:
determine an adjustment based at least in part upon a result of the act of ensuring the correctness of the physical data or the other data; and
apply the adjustment to the physical data or to the other data related to the electrical parasitic or the electrical characteristic.

24. The system of claim 20, in which the partial physical design does not pass a layout versus schematic check or verification.

25. The system of claim 20, in which the at least one processor is to characterize the electrical parasitic or to characterize the electrical characteristic before or at a time of completing creation of a net or modification of an existing net.

26. The system of claim 20, in which the at least one processor is to characterize the electrical parasitic or to characterize the electrical characteristic based at least in part upon a shape or a set of shapes on a net at a time when the net is created or completed.

27. The system of claim 20, in which the at least one processor is to apply the adjustment to the physical data as a part of a placement of one or more devices or a part of a routing process.

28. An article of manufacture comprising a non-transitory computer readable storage medium having a sequence of instructions stored thereupon which, when executed by at least one processor, causes the at least one processor to perform a method for implementing an electronic circuit design with electrical awareness, the method comprising:
using a computer system which comprises at least one processor and is programmed for performing a process, the process comprising:
identifying, determining, or updating physical data of a component that is situated along a partial, incomplete net in a partial, incomplete physical design of the electronic circuit design, wherein the partial, incomplete physical design fails to pass a layout versus schematic check;
characterizing an electrical parasitic that is caused by or determined from at least a physical characteristic of the component in the physical data; and
characterizing an electrical characteristic of the electrical parasitic by performing a simulation with the electrical parasitic prior to completing the partial, incomplete physical design of the electronic circuit design.

29. The article of manufacture of claim 28, the process further comprising:
ensuring correctness of the physical data or other data related to the electrical parasitic or the electrical characteristic, in which the act of ensuring the correctness of the physical data or other data comprises:
performing an extraction based simulation, the act of performing the extraction comprises:
identifying or creating a schematic design for at least a portion of the electronic circuit; and
performing a simulation on the schematic design;
mapping the electrical parasitic to a schematic representation; and
providing the schematic representation to a simulator to re-perform the simulation on the schematic design.

30. The article of manufacture of claim 28, the process further comprising:
determining a hint based at least in part upon a result of the act of ensuring the correctness of the physical data or the other data; and
displaying the hint in a user interface on a display apparatus.

31. The article of manufacture of claim 28, the process further comprising:

determining an adjustment based at least in part upon a result of the act of ensuring the correctness of the physical data or the other data; and applying the adjustment to the physical data or to the other data related to the electrical parasitic or the electrical characteristic.

32. The article of manufacture of claim 28, in which the partial physical design does not pass a layout versus schematic check or verification.

33. The article of manufacture of claim 28, in which the act of characterizing the electrical parasitic or the act of characterizing the electrical characteristic is performed before or at a time of completing creation of a net or modification of an existing net.

34. The article of manufacture of claim 28, in which the act of characterizing the electrical parasitic or the act of characterizing the electrical characteristic is performed based at least in part upon a shape or a set of shapes on a net at a time when the net is created or completed.

35. The article of manufacture of claim 28, in which the act of applying the adjustment to the physical data is performed as a part of a placement of one or more devices or a part of a routing process.

\* \* \* \* \*